United States Patent
Okamoto

(10) Patent No.: US 10,879,367 B2
(45) Date of Patent: Dec. 29, 2020

(54) METHOD FOR MANUFACTURING SEMICONDUCTOR DEVICE

(71) Applicant: Mitsubishi Electric Corporation, Tokyo (JP)

(72) Inventor: Chikayuki Okamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/478,457

(22) PCT Filed: Apr. 19, 2017

(86) PCT No.: PCT/JP2017/015711
§ 371 (c)(1),
(2) Date: Jul. 16, 2019

(87) PCT Pub. No.: WO2018/193550
PCT Pub. Date: Oct. 25, 2018

(65) Prior Publication Data
US 2020/0035803 A1   Jan. 30, 2020

(51) Int. Cl.
*H01L 29/49* (2006.01)
*H01L 29/78* (2006.01)
(Continued)

(52) U.S. Cl.
CPC .... *H01L 29/4941* (2013.01); *H01L 21/28052* (2013.01); *H01L 21/28132* (2013.01);
(Continued)

(58) Field of Classification Search
CPC ......... H01L 21/28052; H01L 21/28132; H01L 29/4933; H01L 29/4941; H01L 29/665; H01L 29/66598; H01L 29/7833
See application file for complete search history.

(56) References Cited

U.S. PATENT DOCUMENTS 5,227,321 A * 7/1993 Lee ..................... H01L 21/266
148/DIG. 143
5,482,895 A 1/1996 Hayashi et al.
(Continued)

FOREIGN PATENT DOCUMENTS

JP   H04-026133 A   1/1992
JP   H06-196496 A   7/1994
(Continued)

OTHER PUBLICATIONS

International Search Report; Written Opinion; and Notification of Transmittal of the International Search Report and the Written Opinion of the International Searching Authority, or the Declaration issued in PCT/JP2017/015711; dated Jul. 11, 2017.
(Continued)

*Primary Examiner* — Allan R Wilson
(74) *Attorney, Agent, or Firm* — Studebaker & Brackett PC

(57) ABSTRACT

A gate electrode (3) is provided on a main surface of a silicon substrate (1) via a gate insulating film (2). A source/drain region (4,5) is provided on sides of the gate electrode (3) on the main surface of the silicon substrate (1). A first silicide (6) is provided on an upper face and side faces of the gate electrode (3). A second silicide (7) is provided on a surface of the source/drain region (4,5). No side-wall oxide film is provided on the side faces of the gate electrode (3). The second silicide (7) is provided at a point separated from the gate electrode (3).

2 Claims, 8 Drawing Sheets

(51) Int. Cl.
*H01L 21/28* (2006.01)
*H01L 29/66* (2006.01)

(52) U.S. Cl.
CPC ........ *H01L 29/4933* (2013.01); *H01L 29/665* (2013.01); *H01L 29/66598* (2013.01); *H01L 29/7833* (2013.01)

(56) References Cited

U.S. PATENT DOCUMENTS

| | | | | |
|---|---|---|---|---|
| 5,541,127 A | * | 7/1996 | Hoshiko | H01L 21/0337 148/DIG. 161 |
| 5,869,378 A | * | 2/1999 | Michael | H01L 21/28123 257/E21.206 |
| 6,069,046 A | * | 5/2000 | Gardner | H01L 21/2652 438/305 |
| 6,835,612 B2 | * | 12/2004 | Cappellani | H01L 21/2652 438/197 |
| 2004/0157380 A1 | * | 8/2004 | Cappellani | H01L 21/2652 438/142 |

FOREIGN PATENT DOCUMENTS

| | | |
|---|---|---|
| JP | H07-307477 A | 11/1995 |
| JP | H09-172171 A | 6/1997 |
| JP | H11-238879 A | 8/1999 |
| KR | 10-0140464 B1 | 7/1998 |
| KR | 10-1999-0015854 A | 3/1999 |

OTHER PUBLICATIONS

Office Action issued in TW 106118657; mailed by the Taiwan Intellectual Property Office dated Nov. 27, 2018.

An Office Action mailed by the Korean Intellectual Property Office dated Oct. 29, 2020, which corresponds to Korean Patent Application No. 10-2019-7029830 and is related to U.S. Appl. No. 16/478,457 with English language translation.

* cited by examiner

METHOD FOR MANUFACTURING SEMICONDUCTOR DEVICE

FIELD

The present invention relates to a semiconductor device wherein silicides are provided on surfaces of a gate electrode and a source/drain region, and a method for manufacturing same.

BACKGROUND

A MOSFET having silicide on the surface of a gate electrode or a source/drain region offers the potential for an improvement in the operating speed because of an expected reduction of resistance in the gate electrode or source/drain region (see, for example, PTL 1 and PTL 2).

CITATION LIST

Patent Literature

[PTL 1] Japanese Patent Application Laid-open No. 11-238879
[PTL 2] Japanese Patent Application Laid-open No. 4-26133

SUMMARY

Technical Problem

In conventional semiconductor devices, a side-wall oxide film is formed on side faces of the gate electrode so as to prevent short-circuiting between the gate electrode and the source/drain region that may be caused by the silicide. The problem, however, was the increased number of process steps because of the necessities of depositing a silicon oxide film and dry etching for forming the side-wall oxide film. Another problem was that silicide could not be formed on the side faces of the gate electrode because of the side-wall oxide film.

The present invention was made to solve the problem described above and it is an object of the invention to provide a semiconductor device that allows formation of silicide not only on an upper face but also on a side face of a gate electrode, and that can prevent short-circuiting between the gate electrode and a source/drain region without forming a side-wall oxide film, and a method for manufacturing same.

Solution to Problem

A semiconductor device according to the present invention includes: a silicon substrate; a gate electrode provided on a main surface of the silicon substrate via a gate insulating film; a source/drain region provided on sides of the gate electrode on the main surface of the silicon substrate; a first silicide provided on an upper face and side faces of the gate electrode; and a second silicide provided on a surface of the source/drain region, wherein no side-wall oxide film is provided on the side faces of the gate electrode, and the second silicide is provided at a point separated from the gate electrode.

Advantageous Effects of Invention

Since no side-wall oxide film is formed in the present invention, the first silicide can be formed not only on the upper side but also on the side faces of the gate electrode. Thus variation in the resistance of the gate electrode can be reduced, the resistance can be decreased. The second silicide on the surface of the source/drain region is formed at a point separated from the gate electrode. With this configuration, short-circuiting between the gate electrode and the source/drain region can be prevented without forming a side-wall oxide film.

DESCRIPTION OF EMBODIMENTS

Figure 1:
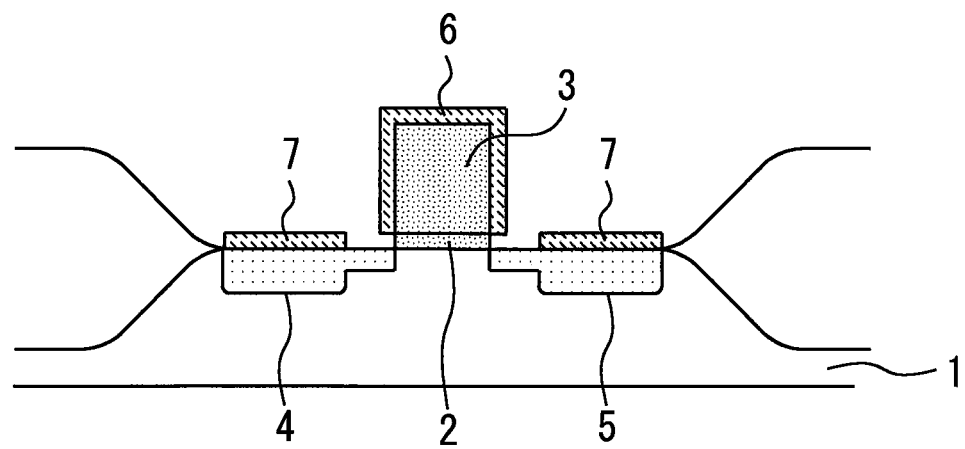
FIG. 1 is a cross-sectional view illustrating a semiconductor device according to an embodiment of the present invention.

FIG. 1 is a cross-sectional view illustrating a semiconductor device according to an embodiment of the present invention. A gate electrode 3 is formed on a main surface of a silicon substrate 1 via a gate insulating film 2. A source region 4 and a drain region 5 are formed on the sides of the gate electrode 3 on the main surface of the silicon substrate 1. A first silicide 6 is formed on an upper face and side faces of the gate electrode 3. A second silicide 7 is formed on the surfaces of the source region 4 and the drain region 5. No side-wall oxide film is formed on the side faces of the gate electrode 3. The second silicide 7 is formed at points separated from the gate electrode 3. The first silicide 6 and the second silicide 7 are separated from each other and not electrically connected.

Next, a method for manufacturing the semiconductor device according to this embodiment will be described. FIG. 2 to FIG. 11 are cross-sectional views illustrating the manufacturing steps of the semiconductor device according to an embodiment of the present invention. First, an isolation oxide film 8 for the purpose of isolation is formed on the silicon substrate 1 by a known method. After that, the silicon substrate 1 is doped with impurities by ion injection, thermal processing, and so on if necessary. In some cases, ion injection may be performed several times perpendicularly and diagonally to the silicon substrate 1 with varying injection conditions to provide an impurity concentration difference between the source and the drain.

Figure 3:
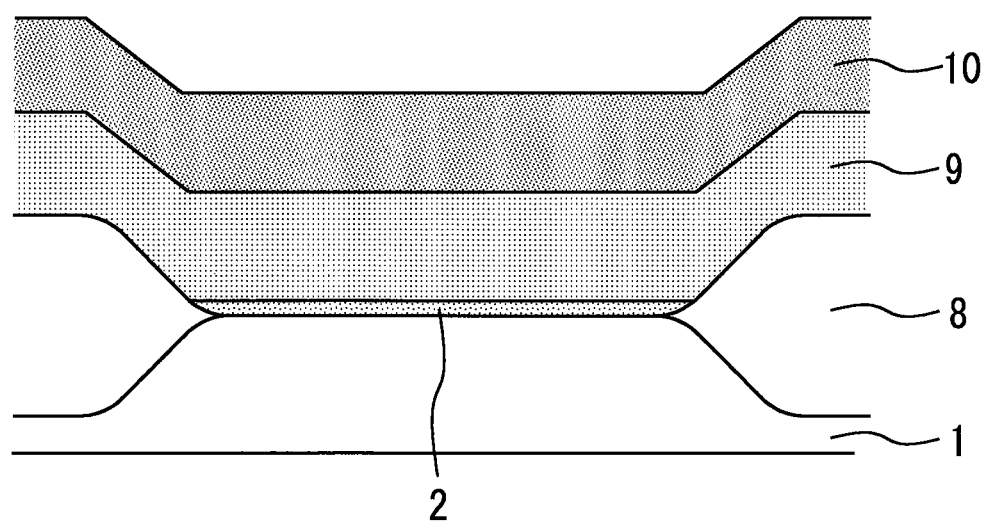
FIG. 3 is a cross-sectional view illustrating a manufacturing step of the semiconductor device according to an embodiment of the present invention.
Figure 4:
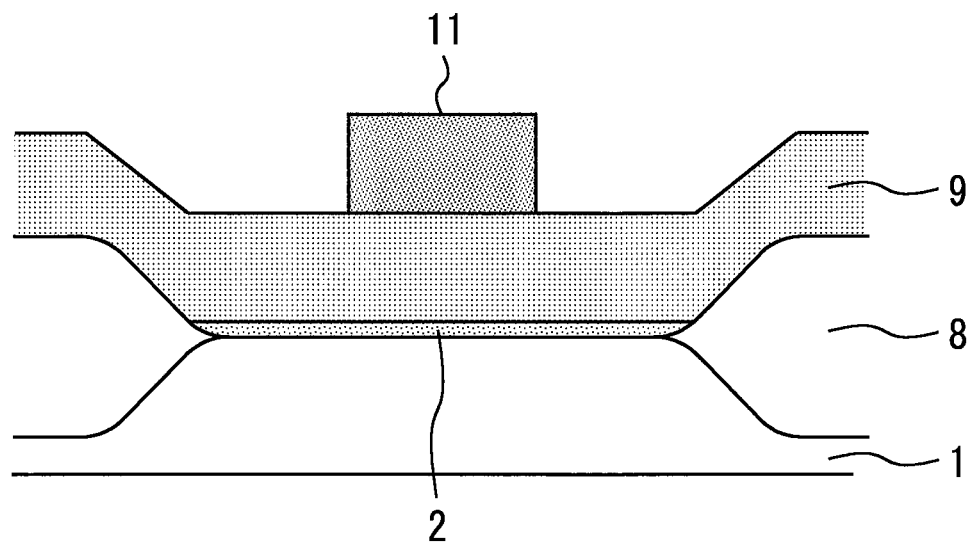
FIG. 4 is a cross-sectional view illustrating a manufacturing step of the semiconductor device according to an embodiment of the present invention.

Next, as shown in FIG. 3, the gate insulating film 2, a polysilicon film 9, and a resist 10 are formed successively on the main surface of the silicon substrate 1. Next, as shown in FIG. 4, the resist 10 is patterned by exposure and development, to form a mask 11 on the polysilicon film 9.

Figure 5:
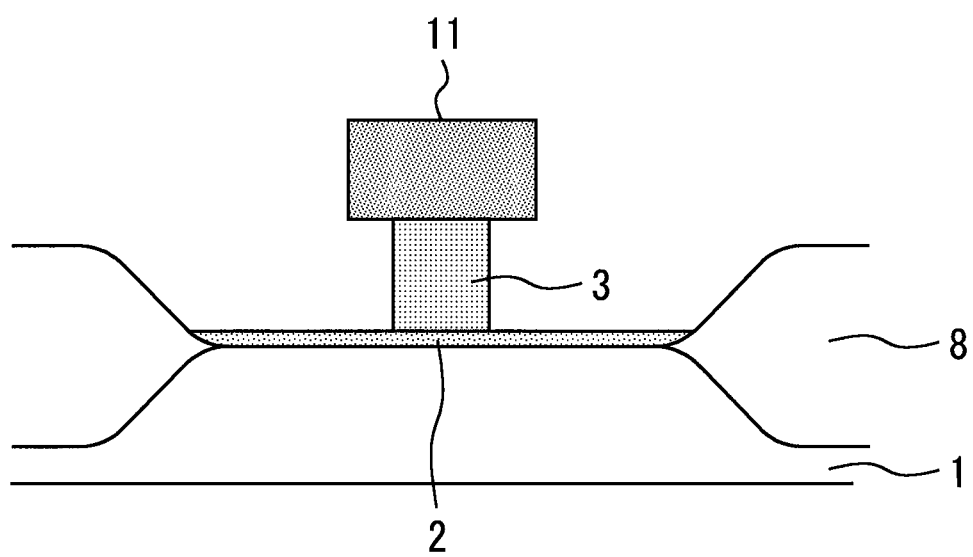
FIG. 5 is a cross-sectional view illustrating a manufacturing step of the semiconductor device according to an embodiment of the present invention.

Next, as shown in FIG. 5, the polysilicon film 9 is anisotropically-etched and isotropically-etched using the mask 11. This causes the polysilicon film 9 to be side etched and set-backed by desired amount from the mask 11 so that a gate electrode 3 having a smaller width than a width of the mask 11 is formed. Anisotropic etching is normally performed using a plasma by providing one or a combination of $Cl_2$, HBr, $SF_6$, and $O_2$ gases. By performing a hydrofluoric acid treatment for several seconds after the anisotropic etching to remove reaction products adhered on the side faces of the gate electrode 3, isotropic etching can be carried out in a stable manner. The isotropic etching is performed using $CF_4$, $SF_6$, $O_2$ gas or the like. A desired amount of side etching can be achieved by adjusting the etching time.

Figure 6:
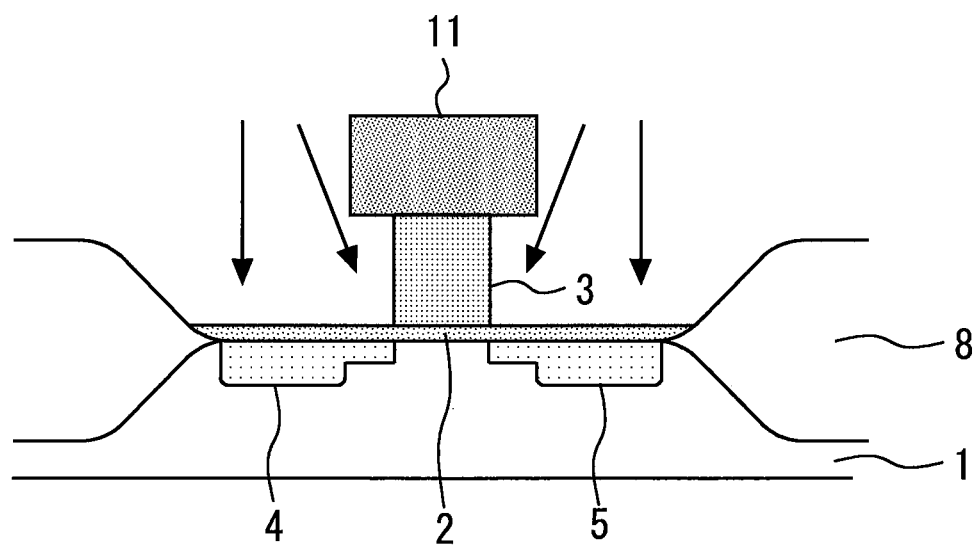
FIG. 6 is a cross-sectional view illustrating a manufacturing step of the semiconductor device according to an embodiment of the present invention.
Figure 7:
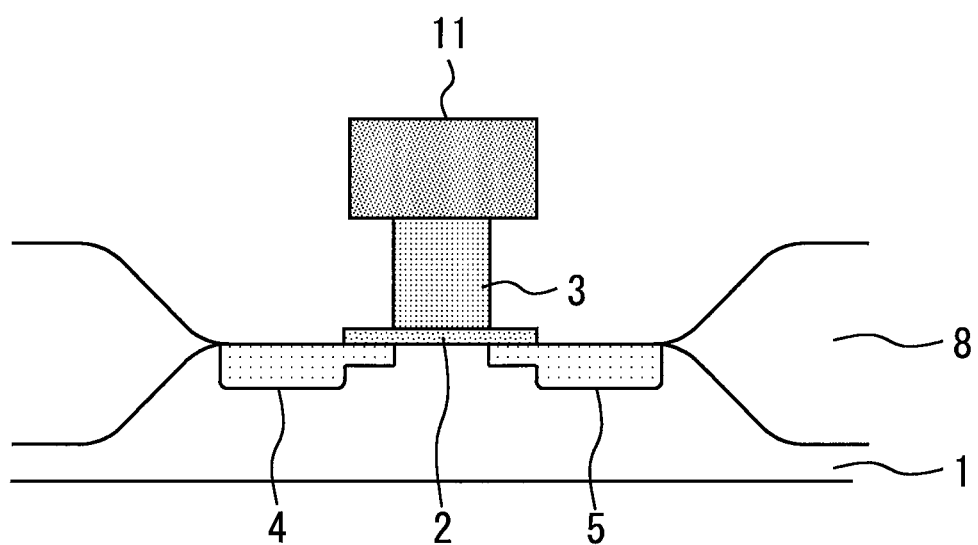
FIG. 7 is a cross-sectional view illustrating a manufacturing step of the semiconductor device according to an embodiment of the present invention.

Next, as shown in FIG. 6, ions are injected to the main surface of the silicon substrate 1 to form a source region 4 and a drain region 5 on the sides of the gate electrode 3. Next, as shown in FIG. 7, the gate insulating film 2 is anisotropically-etched using the mask 11. Thereby, the polysilicon gate electrode 3 and the silicon substrate 1 become exposed except for portions right below the isolation oxide film 8 and the mask 11. The gate insulating film 2 right below the mask 11 remains. Namely, there is not the gate electrode 3 and only the gate insulating film 2 remains on the silicon substrate 1 between the side-etched face of the gate electrode 3 and right below the ends of the mask 11.

Figure 8:
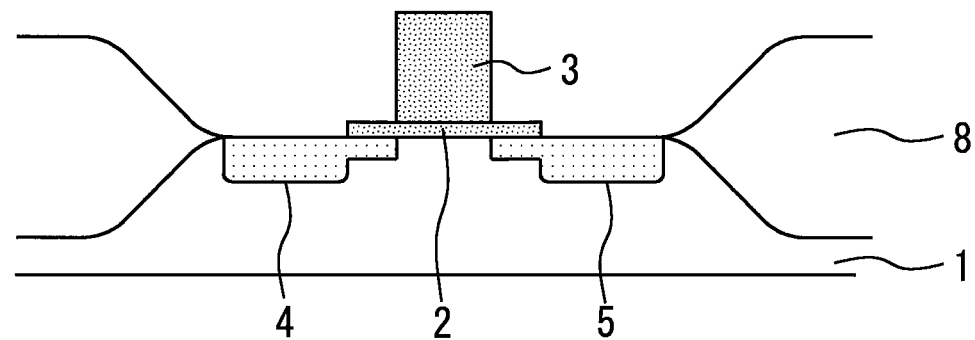
FIG. 8 is a cross-sectional view illustrating a manufacturing step of the semiconductor device according to an embodiment of the present invention.
Figure 9:
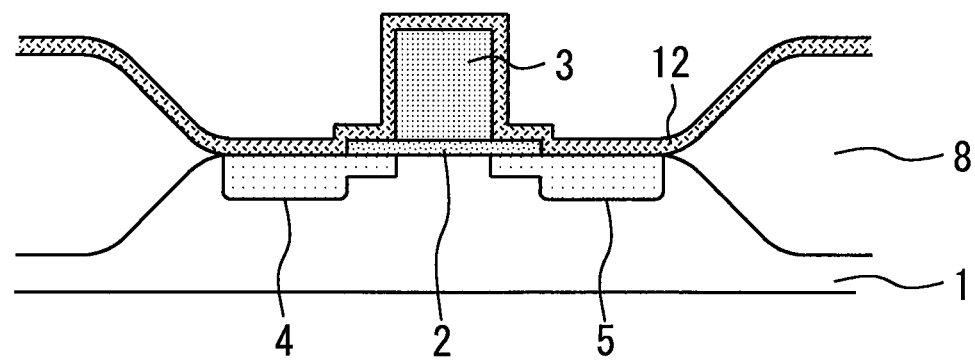
FIG. 9 is a cross-sectional view illustrating a manufacturing step of the semiconductor device according to an embodiment of the present invention.
Figure 10:
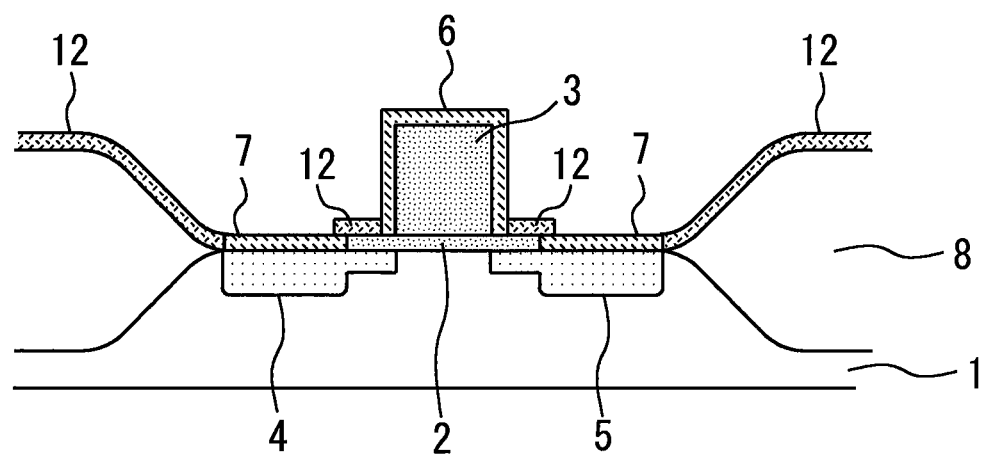
FIG. 10 is a cross-sectional view illustrating a manufacturing step of the semiconductor device according to an embodiment of the present invention.

Next, as shown in FIG. 8, the mask 11 is removed. Next, as shown in FIG. 9, a metal film 12 such as Ti is deposited by sputtering or the like on the entire surface. The metal film 12 is deposited also on the side faces of the gate electrode 3. Next, as shown in FIG. 10, a high-temperature heating treatment is performed at about 600° C. or higher to form the first silicide 6 on the upper face and side faces of the gate electrode 3, and to form the second silicide 7 on the surfaces of the source region 4 and the drain region 5 exposed from the anisotropically-etched gate insulating film 2.

Figure 11:
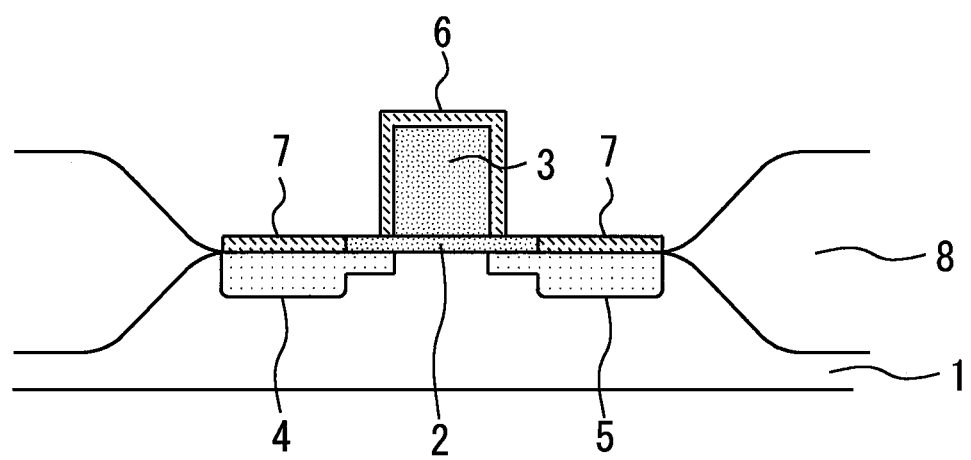
FIG. 11 is a cross-sectional view illustrating a manufacturing step of the semiconductor device according to an embodiment of the present invention.

Next, as shown in FIG. 11, non-silicided portions of the metal film 12 are removed by chemical processing. The metal film 12 on the gate insulating film 2 and isolation oxide film 8 is not silicided and therefore removed in this process. Some parts of the gate insulating film 2 may be silicided by the silicon sucked from the gate electrode 3 or silicon substrate 1. Even so, when the gate insulating film 2 in portions other than righty below the gate electrode 3 is removed by a chemical solution such as hydrofluoric acid, the silicide formed on the gate insulating film 2 can be simultaneously removed by the liftoff effect.

Figure 2:
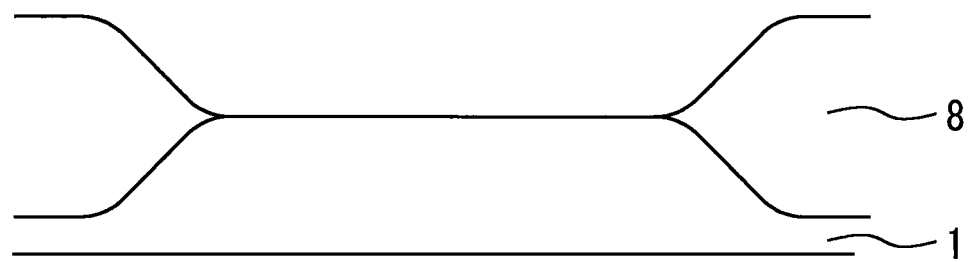
FIG. 2 is a cross-sectional view illustrating a manufacturing step of the semiconductor device according to an embodiment of the present invention.
Figure 12:
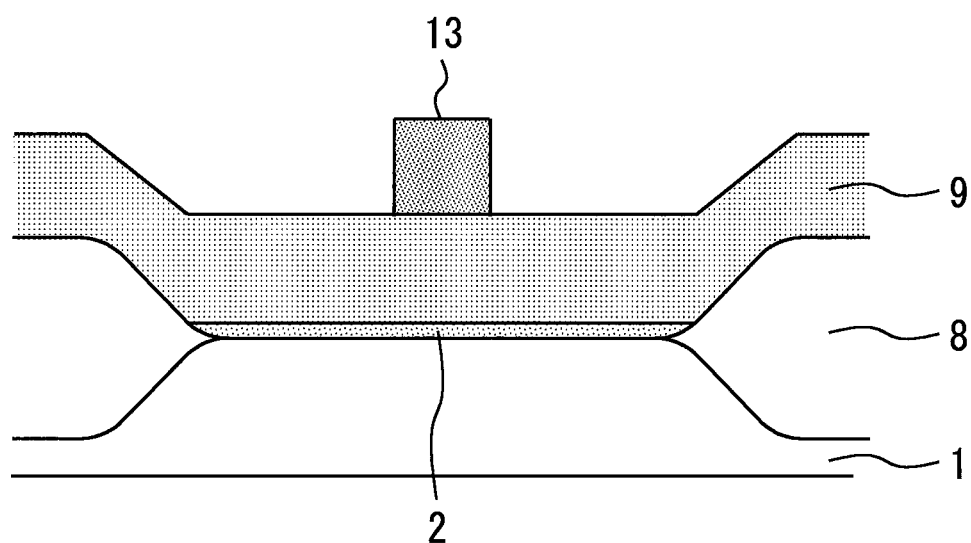
FIG. 12 is a cross-sectional view illustrating a manufacturing step of the semiconductor device according to a comparative example.
Figure 13:
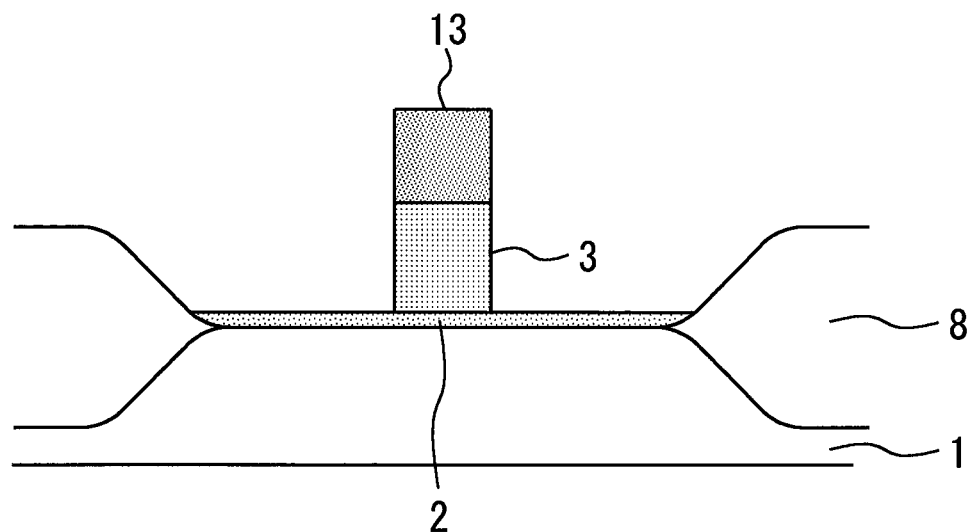
FIG. 13 is a cross-sectional view illustrating a manufacturing step of the semiconductor device according to a comparative example.
Figure 14:
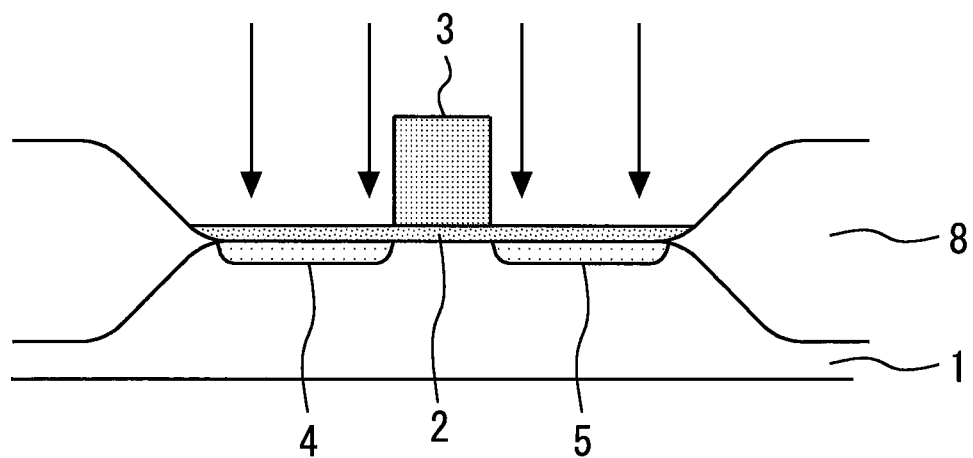
FIG. 14 is a cross-sectional view illustrating a manufacturing step of the semiconductor device according to a comparative example.

The effects of this embodiment will now be explained in comparison with a comparative example. FIG. 12 to FIG. 19 are cross-sectional views illustrating the manufacturing steps of a semiconductor device according to a comparative example. First, manufacturing steps similar to those of FIG. 2 and FIG. 3 are performed. Next, as shown in FIG. 12, the resist 10 is patterned by exposure and development to form a mask 13 on the polysilicon film 9. Next, as shown in FIG. 13, the polysilicon film 9 is anisotropically-etched using the mask 13 to form a gate electrode 3. After that, the mask 13 is removed as required. Next, as shown in FIG. 14, ions are injected into the main surface of the silicon substrate 1.

Figure 15:
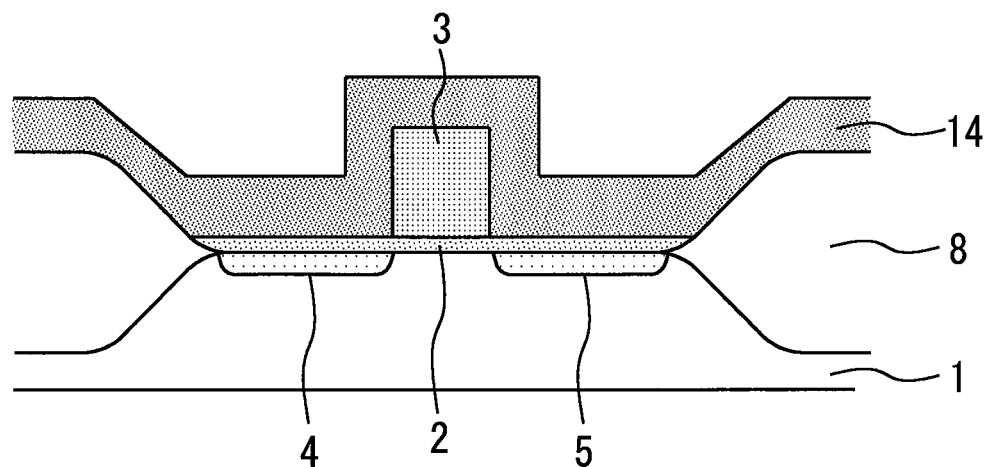
FIG. 15 is a cross-sectional view illustrating a manufacturing step of the semiconductor device according to a comparative example.
Figure 16:
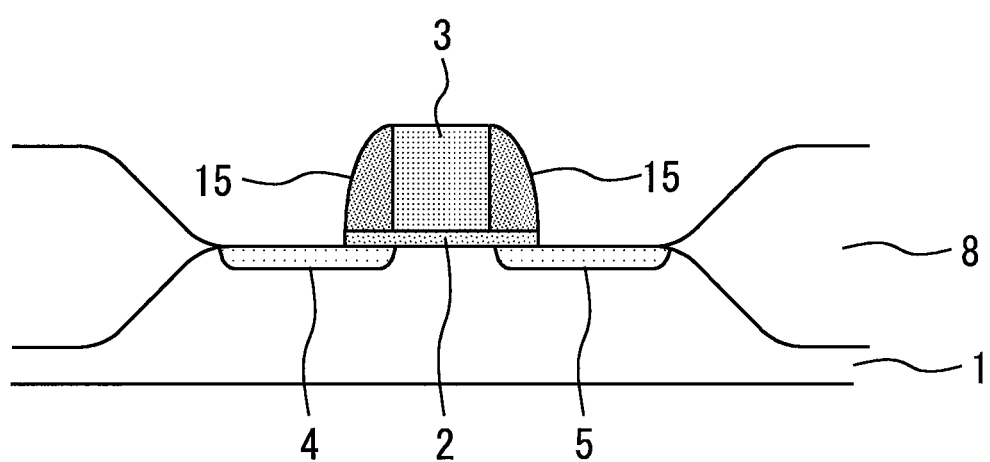
FIG. 16 is a cross-sectional view illustrating a manufacturing step of the semiconductor device according to a comparative example.
Figure 17:
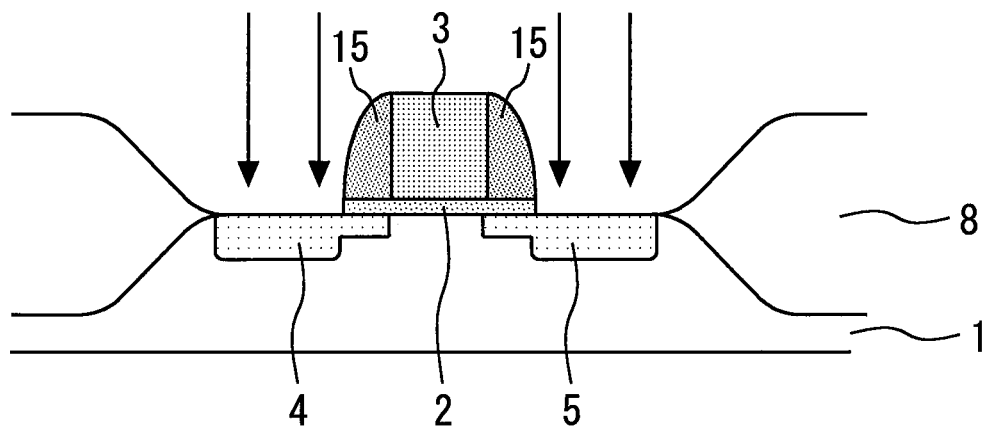
FIG. 17 is a cross-sectional view illustrating a manufacturing step of the semiconductor device according to a comparative example.

Next, as shown in FIG. 15, a silicon oxide film 14 is formed by CVD on the entire surface. Next, as shown in FIG. 16, the silicon oxide film 14 is anisotropically-etched for a suitable duration of time so that a side-wall oxide film 15 remains only on the side faces of the gate electrode 3. Thereby, the polysilicon gate electrode 3 and the silicon substrate 1 become exposed except for portions covered by the isolation oxide film 8 and the side-wall oxide film 15. Next, as shown in FIG. 17, ions are injected to the main surface of the silicon substrate 1 to form a source region 4 and a drain region 5 on the sides of the gate electrode 3. With the side-wall oxide film 15 formed on the side faces of the gate electrode 3, natural oxide films or the like on the gate electrode 3, source region 4, drain region 5, and so on, are removed with a chemical solution such as dilute hydrofluoric acid or the like.

Figure 18:
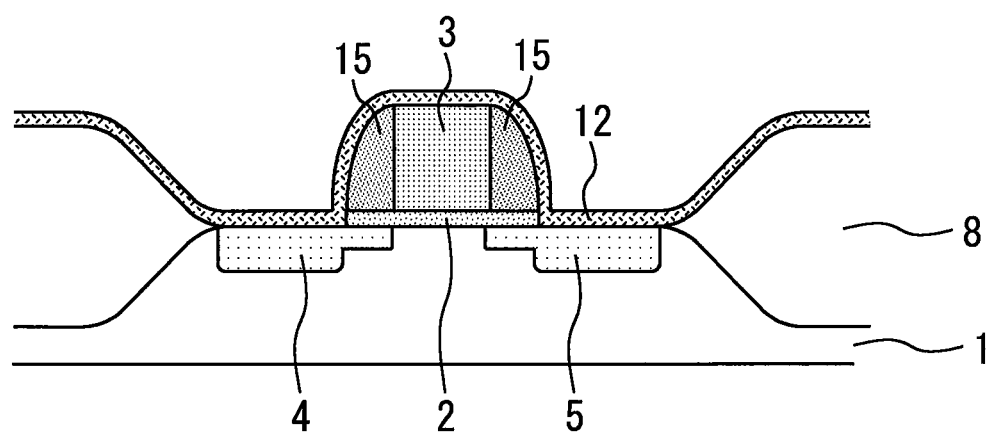
FIG. 18 is a cross-sectional view illustrating a manufacturing step of the semiconductor device according to a comparative example.
Figure 19:
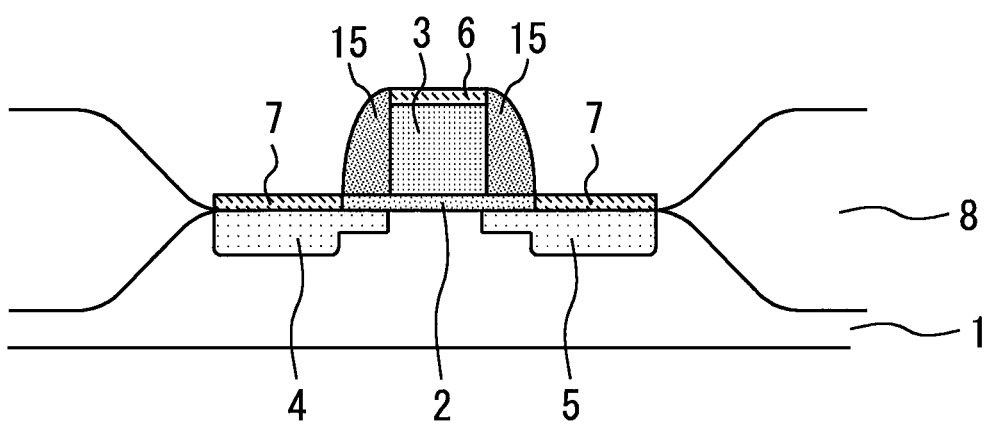
FIG. 19 is a cross-sectional view illustrating a manufacturing step of the semiconductor device according to a comparative example.

Next, as shown in FIG. 18, a metal film 12 such as Ti is deposited by sputtering or the like on the entire surface. Next, as shown in FIG. 19, a heat treatment is performed to form the first silicide 6 on the upper face of the gate electrode 3, and to form the second silicide 7 on the surfaces of the source region 4 and the drain region 5 exposed from the side-wall oxide film 15. After that, non-silicided portions of the metal film 12 are removed by a chemical process.

In the comparative example, deposition of the silicon oxide film and dry etching are necessary for the formation of the side-wall oxide film 15, resulting in an increased number of process steps. Also, silicide cannot be formed on the side faces of the gate electrode 3 because of the side-wall oxide film 15.

On the contrary, since no side-wall oxide film is formed in the embodiment, the first silicide 6 can be formed not only on the upper side but also on the side faces of the gate electrode 3. Thus variation in the resistance of the gate electrode 3 can be reduced, i.e., the resistance can be decreased. The second silicide 7 on the surfaces of the source region 4 and the drain region 5 is formed at points separated from the gate electrode 3. With this configuration, short-circuiting between the gate electrode 3 and the source region 4 or the drain region 5 can be prevented without forming a side-wall oxide film.

In this embodiment, the polysilicon film 9 is anisotropically-etched and isotropically-etched using the mask 13 to form the gate electrode 3 having a smaller width than that of the mask 13, and the gate insulating film 2 is anisotropically-etched using the mask 13, to form the second silicide 7 on the surfaces of the source region 4 and the drain region 5 exposed from the anisotropically-etched gate insulating film 2. No silicide is formed between the gate electrode 3 and the source region 4 and between gate electrode 3 and the drain region 5 because of the gate insulating film 2 present there. Accordingly, the second silicide 7 can be formed at points separated from the gate electrode 3 without forming a side-wall oxide film. The steps of forming the side-wall oxide film are thus made unnecessary, whereby the manufacturing process can be simplified.

While one example was described in this embodiment wherein the surfaces of both source region 4 and drain region 5 are silicided, the present invention can be applied to a configuration where only one of them is silicided.

REFERENCE SIGNS LIST

1 silicon substrate; 2 gate insulating film; 3 gate electrode; 4 source region; 5 drain region; 6 first silicide; 7 second silicide; 9 polysilicon film; 11 mask

The invention claimed is:

1. A method for manufacturing a semiconductor device comprising:

forming a gate insulating film and a polysilicon film successively on a main surface of a silicon substrate;

forming a mask on the polysilicon film;

anisotropically-etching and isotropically-etching the polysilicon film using the mask to form a gate electrode having a smaller width than a width of the mask;

injecting ions to the main surface of the silicon substrate to form a source/drain region on sides of the gate electrode;

anisotropically-etching the gate insulating film using the mask; and forming a first silicide on an upper face and side faces of the gate electrode and forming a second silicide on a surface of the source/drain region exposed from the anisotropically-etched gate insulating film.

2. The method for manufacturing a semiconductor device according to claim 1, wherein the gate insulating film in a portion other than righty below the gate electrode and the silicide on the gate insulating film are simultaneously removed by a liftoff.

* * * * *